United States Patent
Wanner

(10) Patent No.: US 10,340,921 B2
(45) Date of Patent: Jul. 2, 2019

(54) APPARATUSES AND METHODOLOGIES FOR VIBRATION EFFECTS CORRECTION IN OSCILLATORS

(71) Applicant: VT IDIRECT, INC., Herndon, VA (US)

(72) Inventor: Shannon Wanner, Stoneridge, VA (US)

(73) Assignee: VT IDIRECT, INC., Herndon, VA (US)

( * ) Notice: Subject to any disclaimer, the term of this patent is extended or adjusted under 35 U.S.C. 154(b) by 173 days.

(21) Appl. No.: 15/363,191

(22) Filed: Nov. 29, 2016

(65) Prior Publication Data

US 2018/0109263 A1    Apr. 19, 2018

Related U.S. Application Data

(60) Provisional application No. 62/409,583, filed on Oct. 18, 2016.

(51) Int. Cl.
| | |
|---|---|
| H03B 5/04 | (2006.01) |
| H03B 5/32 | (2006.01) |
| H03B 5/36 | (2006.01) |
| H03L 1/00 | (2006.01) |
| G01P 15/18 | (2013.01) |

(52) U.S. Cl.
CPC .............. *H03L 1/00* (2013.01); *G01P 15/18* (2013.01); *H03B 5/04* (2013.01); *H03B 5/32* (2013.01); *H03B 5/36* (2013.01)

(58) Field of Classification Search
CPC .... H03B 5/36; H03B 5/04; H03B 5/32; G01P 15/18; H03L 1/00
USPC .......... 331/175, 116 R, 65, 116 M, 154, 158
See application file for complete search history.

(56) References Cited

U.S. PATENT DOCUMENTS

| | | | |
|---|---|---|---|
| 4,453,141 A | 6/1984 | Rosati | |
| 4,891,611 A | 1/1990 | Frerking | |
| 5,285,995 A | 2/1994 | Gonzalez et al. | |
| 5,659,271 A * | 8/1997 | Tanabe | H03L 1/00 331/10 |
| 5,786,735 A * | 7/1998 | Su | H03L 1/00 331/10 |
| 7,106,143 B2 * | 9/2006 | Bloch | H03B 5/04 331/158 |
| 9,825,639 B2 * | 11/2017 | Patrizi | H03L 7/00 |
| 2003/0112086 A1 | 6/2003 | Tillotson et al. | |
| 2006/0272413 A1 | 12/2006 | Vaganov et al. | |

OTHER PUBLICATIONS

International Search Report and Written Opinion dated Jan. 2, 2018 in PCT/US2017/056883, 10 pages.

(Continued)

*Primary Examiner* — Arnold M Kinkead
(74) *Attorney, Agent, or Firm* — Xsensus LLP

(57) ABSTRACT

A method and system for vibration correction in an oscillator. The method includes sensing vibrations along one or more axes via at least one accelerometer mounted on the oscillator, determining corrective factors based on an acceleration signal received from the at least one accelerometer by referencing a look-up table; and controlling the oscillator based on at least the corrective factors.

18 Claims, 11 Drawing Sheets

(56) References Cited

OTHER PUBLICATIONS

Warner, A.W., et al., "Operation in Mechanical Environments Quartz Crystal Units and Precision Oscillators for Operation in Severe Mechanical Environments", 14th Annual Symposium on Frequency Control, pp. 200-216, (1960) (Abstract only).

Nelson, C., "Reducing Phase Noise Degradation due to Vibration of Crystal Oscillators", Iowa State University Graduate Theses and Dissertations, 85 Pages total, (2010).

Morley, P.E., et al., "Method for Measurement of the Sensitivity of Crystal Resonators to Repetitive Stimuli", Frequency Control Symposium and PDA Exhibition, 5 Pages total, (2002).

Der, L., "Frequency Modulation (FM) Tutorial", URL: http://www.silabs.com/Marcom%20Documents/Resources/FMTutorial.pdf Silicon Laboratories Inc., 12 Pages total, (2008).

Rosati, V.J., "Suppression of Vibration-Induced Phase Noise in Crystal Oscillators: an Update", 41st Annual Frequency Control Symposium, 4 Pages total, (1987) (Abstract only).

\* cited by examiner

US 10,340,921 B2

APPARATUSES AND METHODOLOGIES FOR VIBRATION EFFECTS CORRECTION IN OSCILLATORS

CROSS-REFERENCE TO RELATED APPLICATIONS

This application claims the benefit of priority from U.S. Provisional Application No. 62/409,583 filed Oct. 18, 2016, the entire contents of which are incorporated herein by reference.

BACKGROUND

Vibration has devastating effects on communication and radar equipment as described in A. W. Warner and W. L. Smith, "Quartz crystal units and precision oscillators for operation in severe mechanical environments," 14th Annu. Symp. Freq. Contr., 1960, pp. 200-216. The impact and concern of vibration on electrical systems have been increasing as our population becomes more mobile, communications systems become more interconnected, and information demand increases. Recent trends in the satellite industry technology and the automobile industry push for automated highway with phase array/MIMO (Multiple-Input, Multiple-Output) systems that require very precise phase control. The communication industry is striving to increase spectral efficiencies causing a push towards higher modulation waveform that is placing a higher emphasis on spectral purity of the RF (Radio Frequency).

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY

An aspect of the present disclosure includes a method for vibration correction in an oscillator. The method senses vibrations along one or more axes via at least one accelerometer mounted on the oscillator, determines corrective factors based on an acceleration signal received from the at least one accelerometer by referencing a look-up table; and controls the oscillator based on at least the corrective factors.

Another aspect of the present disclosure includes an oscillator circuit. The oscillator circuit includes a crystal oscillator providing an RF (Radio Frequency) output, an accelerometer mounted on the crystal oscillator for sensing vibrations and for providing an acceleration signal associated with the vibrations; and processing circuitry. The processing circuitry is configured to determine corrective factors as a function of the acceleration signal by referencing a look-up table, and control the crystal oscillator based on at least the corrective factors.

Another aspect of the present disclosure includes a communication system. The communication system includes at least one electronic device being clocked by an oscillator circuit, wherein the oscillator circuit includes a crystal oscillator providing an RF (Radio Frequency) output, an accelerometer mounted on the crystal oscillator for sensing vibrations and for providing an acceleration signal associated with the vibrations, and processing circuitry configured to determine corrective factors as a function of the acceleration signal by referencing a look-up table, and control the crystal oscillator based on at least the corrective factors.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
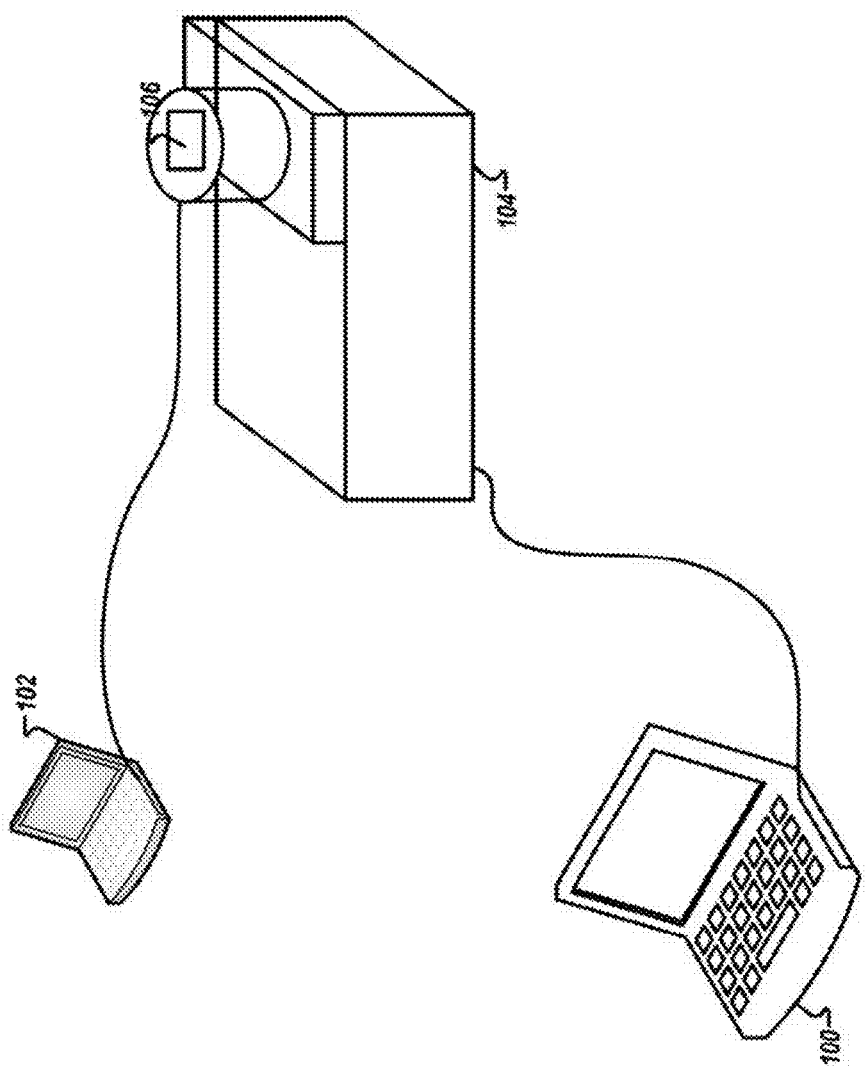
FIG. 1 illustrates a system for calibration of a corrective vector of a crystal oscillator according to one example.

Referring now to the drawings, wherein like reference numerals designate identical or corresponding parts throughout several views, the following description relates to apparatuses and associated methodologies for vibration correction.

Vibration cancellation methods may be categorized between active and passive corrective approaches. The passive corrective approaches can be broken down further into various mechanical isolation systems such as combining vibrational opposing crystals to reduce vibration affects or mechanical shock absorbers as described in C. Nelson, "Reducing phase noise degradation due to vibration of crystal oscillators," (2010), Graduate Theses and Dissertations, Paper 11900. The passive corrective approaches may be problematic due to cost and size. With advent of new cost effective vibration sensing technology, the active approaches become attractive and easily implementable given common circuitry in most designs.

An analog implementation method is described in V. J. Rosati, "Suppression of vibration effects on piezoelectric crystal resonators," U.S. Pat. No. 4,453,141 incorporated herein by reference in its entirety. A mixed signal implementation is described in M. E. Frerking, "Vibration compensated crystal oscillator," U.S. Pat. No. 4,891,611 incorporated herein by reference in its entirety. Both known methods have limiting qualities preventing successful correction at higher vibration frequencies. The limiting factor is the ability to provide correction for modulation and g-sensitivity frequency response of VCXO. In addition, calibration methods described in known methods do not provide exact correction.

The methods of the present disclosure enhance active compensation theory by determining an exact corrective factor. Both digital and analog implementation methods are described herein.

The instantaneous frequency of an oscillator under-vibration can be expressed as $$w(t) = w_o\{1 + \gamma\alpha_{vib}\cos(w_v t)\} \tag{1}$$

where $w_v$ is the vibration frequency, $w_o$ is the fundamental frequency of resonators, $\gamma$ is the magnitude component of the g-sensitivity vector, and $\alpha_{vib}$ is the amplitude of acceleration as described in W. Warner and W. L. Smith, "Quartz crystal units and precision oscillators for operation in severe mechanical environments," 14th Annu. Symp, Freq. Contr., 1960, pp. 200-216 incorporated herein by reference in its entirety.

The instantaneous phase can be determined from integration of the instantaneous frequency response $$\varphi(t) = w_o t + \gamma\alpha_{vib}\frac{w_o}{w_v}\sin(w_v t) \tag{2}$$

and therefore the waveform of the oscillator can be expressed as $$v(t) = \cos\left\{w_o t + \gamma\alpha_{vib}\frac{w_o}{w_v}\sin(w_v t)\right\}. \tag{3}$$

Assuming the modulation in index is small, $$\frac{\gamma\alpha_{vib}w_o}{w_v},$$

equation (3) can be expanded using Bessel functions and the spectrum can be described by the following $$\gamma(f) = \frac{2w_v}{\alpha_{vib}w_o}10^{L(f)/20} \tag{4}$$

where L is the relative level dBc (Decibels relative to the carrier) for the first order sideband. The resultant spectrum equation (4) may be used in determining the g-sensitivity vector using a signal or spectrum analyzer. The g-sensitivity vector can be measured, for example, in laboratory via a spectrum analyzer and a controlled vibration table, by applying equation (4) to determine orthogonal axial components of the g-sensitivity vector, and performing the RMS (Root Mean Square) sum of the axial components as expressed by $$\gamma(f) = \sqrt{\gamma_x^2 + \gamma_y^2 + \gamma_z^2} \tag{5}$$

Then, the spectral response may be expressed as $$L(f) = 20 * \log10\left(\frac{\vec{\gamma} \cdot \vec{\alpha}w_o}{2w_v}\right) \tag{6}$$

where $\vec{\gamma}$ is the g-sensitivity vector and $\vec{\alpha}$ is the acceleration vector.

FIG. 1 illustrates a system for spectral response measurements that can be used to calibrate a corrective vector of a crystal oscillator 106 according to one example. The system may include a vibration table 104 controlled via computer 100. A spectrum analyzer 102 may record the spectral response of the crystal oscillator 106. Most systems may have frequency dependency of the g-sensitivity vector and measurements may be conducted up to a vibration frequency of interest. Typically, upper limits of 500 Hz and 2 kHz are common in air-borne and vehicle applications. The resonance effects on most PCB (Printed Circuit Board) designs become a concern above 1 kHz and may have amplification of the input vibration excitation. The PCB resonant effect may have severe frequency dependent response. The measurement of the g-sensitivity vector may be measured on a product-by-product basis to account for mechanical resonances of the system using the setup shown in FIG. 1. With the crystal under vibration at a frequency $w_v$, the spectrum measured by the spectrum analyzer 102 includes spectral lines at $\pm f_v$. From the spectrum, the relative level of the first side band with respect to the carrier (fundamental frequency) may be determined and the g-sensitivity may be found using equation (4). For example, the g-sensitivity of an oscillator may be measured during fabrication of an apparatus, a system, or a device that includes a crystal oscillator. The g-sensitivity in ppb/g (parts-per-billions/g) is stored to be used during the operation of the crystal oscillator as described further below. The g-sensitivity is measured on all 3-axis (e.g., x-axis, y-axis, z-axis) and along with frequency dependent information needed for frequency compensation as described later herein.

The vibration effects on PSK (Phase Shift Keying) and QAM (Quadrature Amplitude Modulation) modulations can be devastating. An 8PSK signal can be described by the following equation $$v_{rf}(t) = A_{mod}\cos\left(wt + \frac{\pi n}{4}\right) \text{ where } n = 1, 2 \ldots 8 \tag{7}$$

Figure 2:
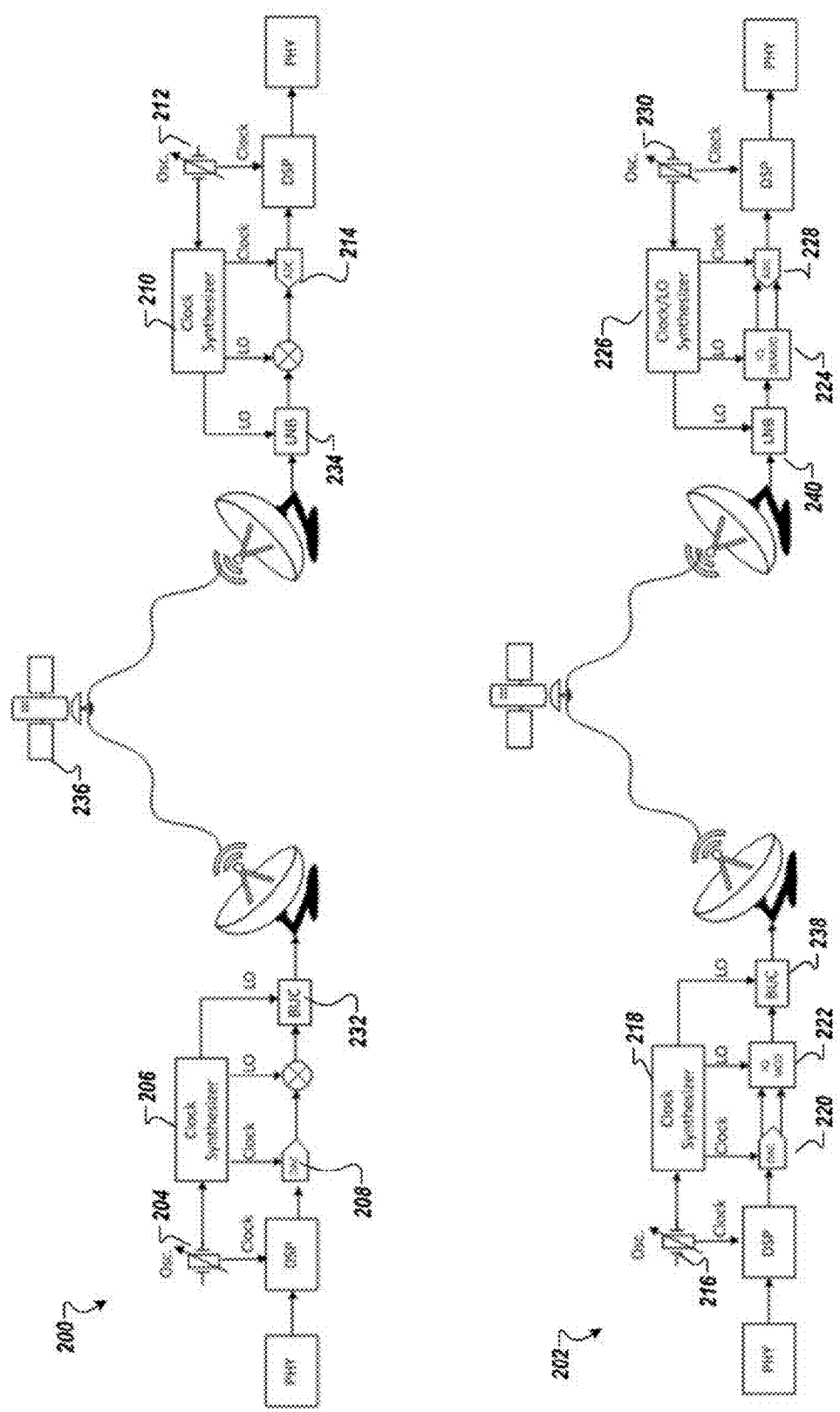
FIG. 2 is a schematic that shows exemplary block diagrams of communication systems according to one example.

FIG. 2 is a schematic that shows exemplary satellite communication systems according to one example. In a first communication system 200, the baseband information is up-converted to RF (Radio Frequency) through RF direct synthesis/sampling by a clock/LO (Local Oscillator) synthesizer 206 which is being clocked via a vibrational sensitive oscillator 204, followed by a DAC (Digital to Analog Converter) 208. A BUC (Block Upconverter) 232 converts the signal to a higher frequency. The BUC 232 uses LO 206. The baseband information received via satellite 236 is down converted using a second clock/LO synthesizer 210 and a LNB (low noise block) 234 clocked via a second oscillator 212, prior to the conversion to a digital baseband information by ADC (Analog to Digital converter) 214.

In a second exemplary communication system 202, the digital baseband signal is converted to analog by a DAC 220 driven by a clock/LO synthesizer 218 which is clocked by a vibrational sensitive oscillator 216. The analog baseband signal is up-converted to RF frequency using a modulator 222 and a BUC 238. The received analog modulated signal is demodulated using a demodulator 224 driven by a LO/clock synthesizer 226 which is being clocked by a vibrational sensitive oscillator 230. The demodulated analog signal is converted to a digital baseband signal using a ADC 228 and a LNB 240 driven by the LO/clock synthesizer 226 which is being clocked by the vibrational sensitive oscillator 230. The transmitters and the receivers in systems 200, 202 also include DSPs to process information received from the physical layer.

Comparing Equations (3) and (7), the vibrational modulated RF signal can be expressed as $$v_{rf}(t) = A_{mod}\cos\left\{w_o t + \frac{\pi n}{4} + \gamma \alpha_{vib}\frac{w_o}{w_v}\sin(w_v t)\right\} \quad (8)$$

where $n = 1, 2 \ldots 8$

Figure 3:
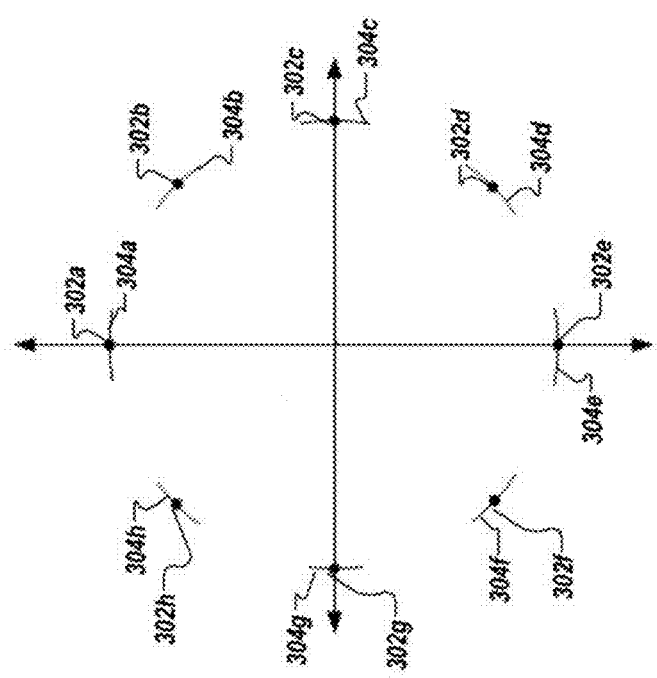
FIG. 3 is an 8PSK (Eight Phase Shift Keying) communication scheme under stationary and vibrating conditions according to one example.

The impacts on the modulation are depicted in FIG. 3, where 302a, 302b, 302c, 302d, 302e, 302f, 302g, 302h represent 8PSK modulation signal depicted in an IQ constellation and 304a, 304b, 304c, 304d, 304e, 304f, 304g, 304h represent the additive phase noise induced by vibration and the impacts on the oscillator associated with the 8PSK modulation. The additive phase noise may decrease the spectral efficiency of a modulation standard. Another aspect of communication networks is the ability to achieve timing synchronization among multiple nodes of timing networks. Similar to the impact on the IQ constellation, the vibration impact on a timing reference is an increase in the short-term stability and jitter.

Figure 4:
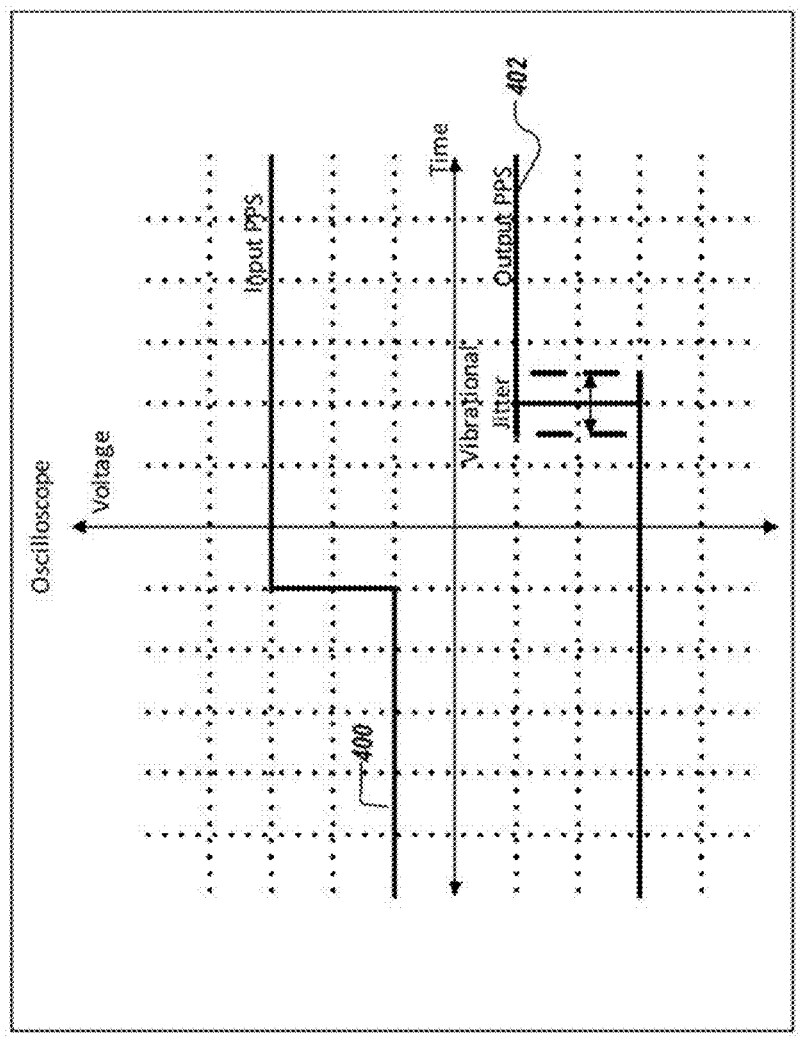
FIG. 4 is a schematic that shows an output jitter of a PPS (Pulse Per Second) clock under vibrating conditions according to one example.

FIG. 4 is a schematic that shows an output jitter of a PPS (Pulse Per Second) clock under vibrating conditions according to one example. Trace 402 shows a PPS (pulse per second) signal that is the output of a clock module obtained using an oscilloscope set to persistence mode and triggered on an input PPS 400 controlled by the clock module. The output jitter increases from 4 ns to 25 ns in the presence of a 1G random vibration profile.

Similarly to the derivation of vibrational effects on a crystal, the modulation message of a FM carrier at frequency $w_0$ is can be expressed as $$m(t) = \alpha_m \cos(w_m t) \quad (9)$$

where $\alpha_m$ is the amplitude of the modulation message and $w_m$ is the frequency of the modulation message.

When applied to the input of a VCXO (Voltage Controlled Crystal Oscillator), the resultant output can be expressed as $$v(t) = \alpha_m \cos\left\{w_o t + 2\pi K_{VCO}\int_0^t m(\tau)d\tau\right\} \quad (10)$$

or $$v(t) = \alpha_m \cos\left\{w_o t + \frac{2\pi K_{VCO}\alpha_m}{w_m}\sin(w_m t)\right\} \quad (11)$$

where $K_{VCO}$ is the tuning slope of VCXO as described in L. Ders, "*Frequency Modulation (FM) Tutorial*".

Given that both equation (3) and equation (11) take the same form and assuming superposition, in theory, the vibrational effect can be completely canceled out when $$w_m = w_v \text{ and } \alpha_m = -\frac{w_o(\gamma_x\alpha_x + \gamma_y\alpha_y + \gamma_z\alpha_z)}{2\pi K_{VCO}} \quad (12)$$

Based on equation (12), an active corrective mechanism can be achieved given that the g-sensitivity vector can be correctly determined. Note that equation (12) assumes no frequency dependence of g-sensitivity vector or modulation bandwidth of the VCXO. In one embodiment, taken the effects of the frequency dependence of the g-sensitivity vector and/or modulation bandwidth of the VCXO into account, equation (12) can be expressed as $$\alpha_m(f) = -M(f)\frac{w_o\{\gamma_x(f)\alpha_x(f) + \gamma_y(f)\alpha_y(f) + \gamma_z(f)\alpha_z(f)\}}{2\pi K_{VCO}} \quad (13)$$

where M(f) is the modulation response of the VCXO. The modulation frequency response can be described as the VCXO ability to induce frequency change on the output of the VCXO when excitation is applied to the VCXO control voltage. Flattening the frequency response of the VCXO can be accomplished through corrective compensation using analog/digital filters. The group delay through the VCXO increases near and past the bandwidth and thus inherently affect a real time corrective response.

As can be seen from equations (3), (11), and (12), the error in cancellation is caused by imperfections in amplitude, frequency, and phase of the corrective modulation. If coherence is assumed, only the phase and amplitude errors exist. Hence, the sum of the phase shifted sine waves may be expressed as $$E_{sum} = \sqrt{E_{vib}^2 + E_{cor}^2 - 2*E_{vib}E_{cor}\cos(\theta_{delta})} \quad (14)$$

where $E_{vib}$ is the amplitude of a vibrational induced modulation, $E_{cor}$ is the amplitude of the corrective FM modulation, and $\theta_{delta}$ is phase or time delay between the vibrational and corrective modulation.

Expressing the corrective amplitude as a ratio of error amplitude $$E_{sum} = E_{vib}\sqrt{1 + R^2 - 2R\cos(\theta_{delta})} \quad (15)$$

where R is the ratio of corrective to vibrational induced modulation.

The delta error then results in $$\text{Correction} = 20*\log10\left(\frac{\sqrt{1+R^2-2*\cos(\theta_{delta})}}{2}\right) = \\ 10*\log10\left(\frac{1+R^2-2R*\cos(\theta_{delta})}{4}\right) \quad (16)$$

Figure 5:
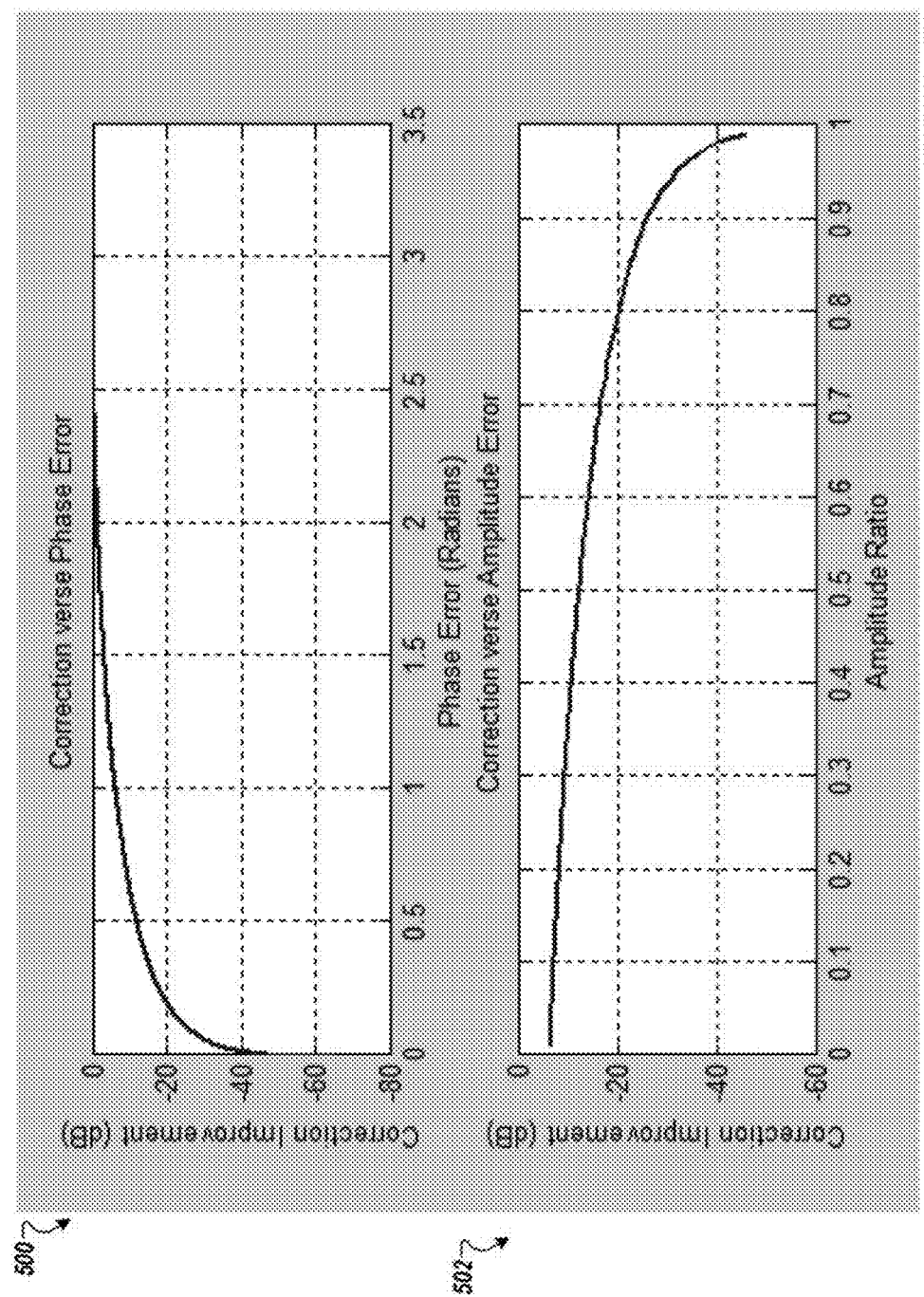
FIG. 5 is a schematic that shows correction improvement with respect to the phase and amplitude error according to one example.

FIG. 5 is a schematic that shows correction improvement with respect to the phase and amplitude plot according to one example. The phase and amplitude play a critical role in being able to compensate for the vibration as described in V. J. Rosati, "Suppression of Vibration-Induced Phase Noise in Crystal Oscillators: An Update," 41st Annual Frequency Control Symposium, 1987.

Schematic 500 shows the correction improvement in dB versus the phase error in radians. Schematic 502 shows the correction improvement versus the amplitude error.

Thus, the g-sensitivity vector and modulation bandwidth of the oscillator may be measured along the three- axis up to a vibration frequency of interest. Another manufacturing interest is the calibration of MEMS sensors and gain parameters.

Figure 6:
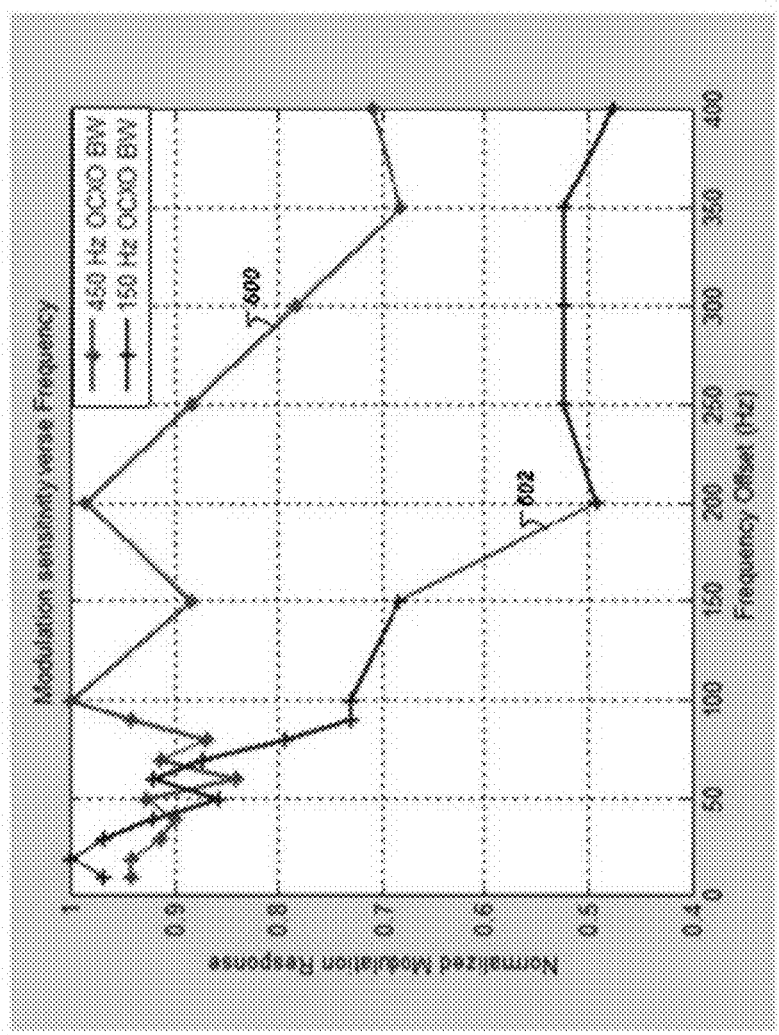
FIG. 6 is a schematic that shows a normalized modulation response of a voltage controlled OCXO (Oven Controlled Crystal Oscillator) according to one example.

FIG. 6 is a schematic that shows a normalized modulation response of a voltage controller OCXO (Oven Controlled Crystal Oscillator) according to one example. Trace 600 shows the normalized modulation response for a 450 Hz OCXO bandwidth. Trace 602 shows the normalized modulation response for a 150 Hz OCXO bandwidth As shown in FIG. 6, the modulation bandwidth response of OCXO can be quite narrow depending on the internal topology of the OCXO crystal.

Therefore, the modulation response and any frequency dependency of the g-sensitivity vector along each axis may be taken into account when designing a corrective vector.

The analog and mixed signal corrective response can be rewritten to include frequency response of external components $$\alpha_m(f) \approx -L_{dig}(f)L_{an}(f)G(f)M(f)\frac{w_o\{L_x(f)\gamma_x(f)\alpha_x(f) + L_y(f)\gamma_y(f)\alpha_y(f) + L_z(f)\gamma_z(f)\alpha_z(f)\}}{2\pi K_{VCO}} \quad (17)$$

$$\alpha_m(f) \approx \\ -L_{sum}(f)G(f)M(f)\frac{w_o\{L_x(f)\gamma_x(f)\alpha_x(f) + L_y(f)\gamma_y(f)\alpha_y(f) + L_z(f)\gamma_z(f)\alpha_z(f)\}}{2\pi K_{VCO}} \quad (18)$$

The following conditional statement $$1 = L_{sum}(f)G(f)M(f) \text{ or } 1 = L_{dig}(f)L_{an}(f)G(f)M(f) \quad (19)$$

with $$\frac{L_x(f)\gamma_x(f)}{2\pi K_{VCO}} = c_x \text{ and } \frac{L_y(f)\gamma_y(f)}{2\pi K_{VCO}} = c_y \text{ and } \frac{L_z(f)\gamma_z(f)}{2\pi K_{VCO}} = c_z \quad (20)$$

result in an ideal correction, where $c_x$, $c_y$, and $c_z$ are spectrally flat corrective vectors up to the vibrational frequency of interest. Having independent corrective variables $$L_{sum}(f)G(f) \text{ or } L_{dig}(f)L_{an}(f)G(f) \quad (21)$$

and $$L_x(f), L_y(f), \text{ and } L_z(f) \quad (22)$$

lead for easier correction of frequency response with calibrated vector. The mixed signal response from MEMS data is sufficiently oversampled in order to minimize the penalty of the time delay from filter bank. The oversampling ratio can be determined from FIG. 5 by the phase error or time delay induced by DSP (Digital Signal Processor) processing to counter act the frequency response of the system.

Figure 7A:
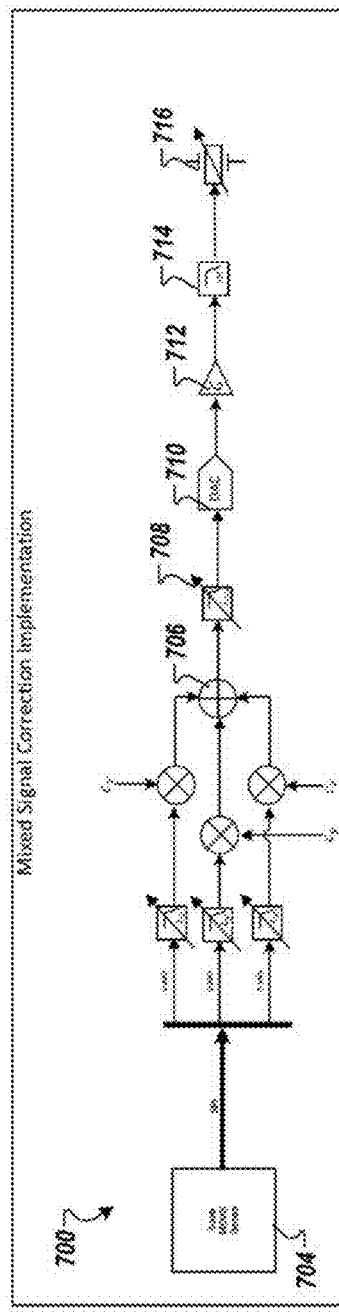
FIG. 7A is a block diagram of a mixed signal implementation for vibration correction according to one example.

FIG. 7A is a block diagram of a mixed signal implementation 700 for vibration correction according to one example. The system 700 may include a 3-axis MEMS sensor 704. Note that the MEMS (Micro-Electro-Mechanical System) sensor was selected for an economical approach given the increasing demand in smart phones and gaming technology but other sensors may be used as would be understood by one of ordinary skill in the art. Accelerometers manufactured using technologies of an even smaller scale, such as nanotechnology, also may be used.

The MEMS sensor 704 is mechanically connected to the oscillator 716 directly or indirectly for sensing the frequency and magnitude of the vibration present. The sensor 704 measures the acceleration along three orthogonal axes (e.g., x-axis, y-axis, and z-axis). The signal from the MEMS sensor 704 is altered by the spectrally compensated response associated with each of the orthogonal axis. Each signal is multiplied by the corresponding corrective factors. The corresponding corrective factors may be determined via a look-up table based on the measured acceleration vector. In one implementation, the look-up table is precomputed using the setup shown in FIG. 1. For example, the corrective factors associated with each axis are calculated using equation (20). Then, the corrected outputs are summed 706, filtered 708, and converted to analog via a DAC 710. The signal is then multiplied by a predetermined gain factor 712 to spectrally compensate for the modulation response of the oscillator. Then, the signal is passed through a LPF 714. The corrective signal is then fed to the oscillator 716.

Figure 7B:
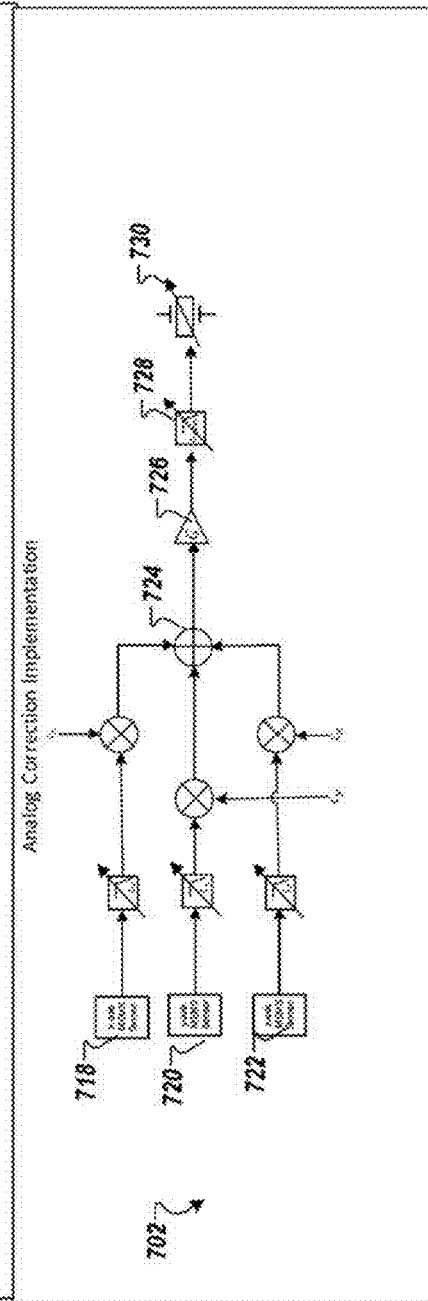
FIG. 7B is a block diagram of an analog signal implementation for vibration correction according to one example.

FIG. 7B is a block diagram of an analog correction implementation 702 for vibration correction according to one example. The analog implementation 702 may include a first accelerometer 718, a second accelerometer 720, and a third accelerometer 722. Each accelerometer is configured to measure the acceleration measurement along an axis (e.g., x-axis, y-axis, and z-axis).

The signals from each accelerometers 718, 720, 722 are altered by the spectral response associated with each of the orthogonal axis. Each signal is multiplied by the corresponding corrective factors. The corresponding corrective factors may be determined via a look-up table based on the measured acceleration vector. Then, the corrected outputs are summed 724. The signal is then multiplied by a predetermined gain factor 726. Then, the signal is passed through a LPF 728. The corrective signal is then fed to the oscillator 730.

The pure analog implementation (e.g., implementation 702) provides real time correction. The mixed signal has the advantage over analog implementation because the mixed signal can provide calibrated weighting of the corrective signal from a look-up table and a customizable frequency response. The disadvantage is that there is more digitally induced time delay in the mixed signal implementation 700 compared to the analog implementation 702 and also lack in the degrees of freedom to counter act frequency response without paying a significant time delay penalty.

The modules (e.g., filters, ADC, DAC, summer) described in 700, 702 may be implemented as either software and/or hardware modules and may be stored in any type of computer-readable medium or other computer storage device. For example, each of the elements (e.g., filters) described herein may be implemented in circuitry that is programmable (e.g. microprocessor-based circuits) or dedicated circuits such as application specific integrated circuits (ASICS) or field programmable gate arrays (FPGAS). In one embodiment, a central processing unit (CPU) could execute software to perform the functions attributable to each of the modules described herein. The CPU may execute software instructions written in a programing language such as Java, C, or assembly. One or more software instructions in the modules may be embedded in firmware, such as an erasable programmable read-only memory (EPROM).

Figure 8A:
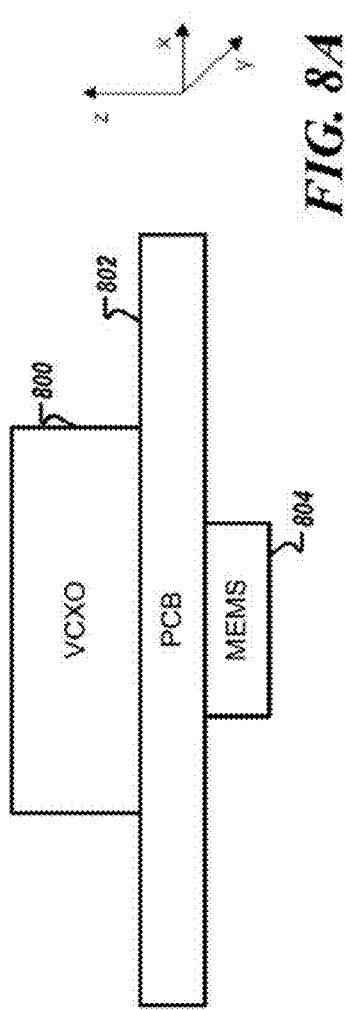
FIG. 8A is a schematic that shows a PCB (Printed Circuit Board) layout implementation of MEMS (Microelectromechanical System) sensor according to one example.

The placement of the MEM sensor is configured to accurately record the vibration which the oscillator sees. As depicted in FIG. 8A, the z-axis of the oscillator typically has the most sensitivity to vibration. In one embodiment, the placement of the MEM sensor is configured to be optimal along the z-axis. Therefore, from mechanical and symmetry standpoints a preferred location is to place the MEMS sensor 804 directly beneath the VCXO 800. For example, the MEMS sensor 804 may be positioned below the PCB 802 holding the VCXO 800.

Figure 8B:
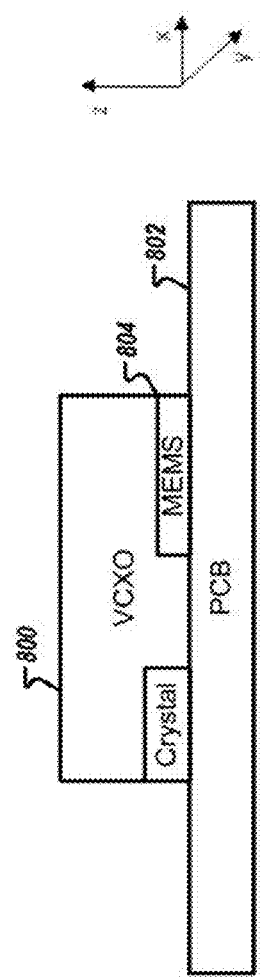
FIG. 8B is a schematic that shows a PCB layout implementation of MEMS sensor according to one example.

FIG. 8B shows an alternative layout. The MEMS sensor 804 may be positioned above the PCB 802 in the VCXO 800 circuitry.

During fabrication of the vibration compensated crystal oscillator, the oscillator is placed on a vibration table (e.g., vibration table 104 of FIG. 1) to determine the g-sensitivity vector. In addition, the modulation frequency response of the oscillator is determined. The weights of the analog and digital filters (e.g., 712) of implementations 700, 702 are calculated and stored based on the modulation frequency response.

Figure 9:
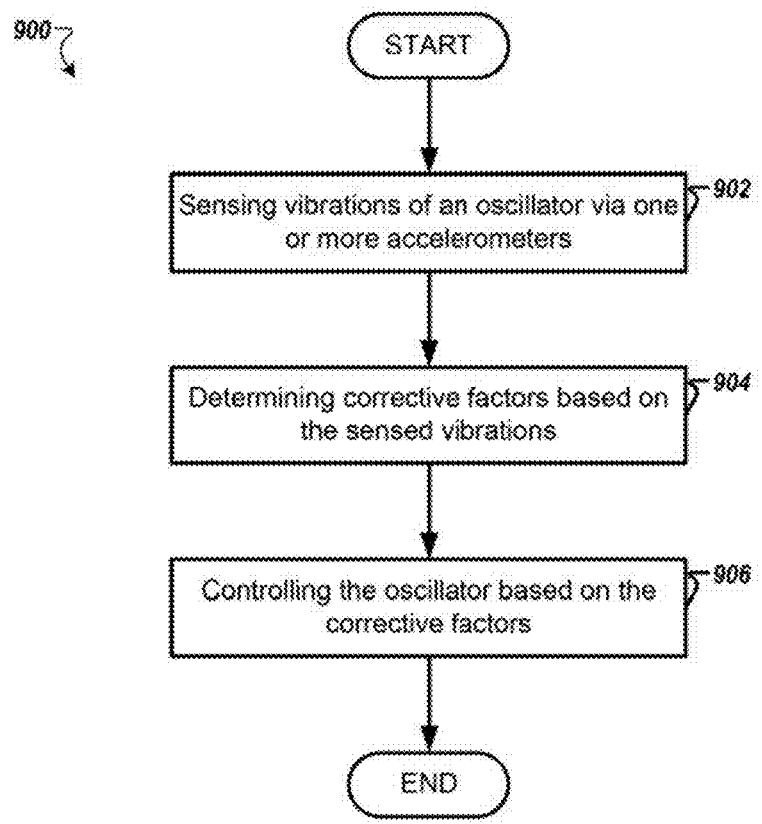
FIG. 9 is a flowchart illustrating a method for vibration correction in an oscillator according to one example.

FIG. 9 is a flowchart illustrating a method 900 for vibration correction in an oscillator according to one example. The method 900, for example, may be performed during the operation of the oscillator by processing circuitry of a receiver, a transmitter, or the like.

In some implementations, the method 900 begins by sensing vibrations of an oscillator (902) along one or more axes. For example, the vibration may be sensed by one or more accelerometers.

In some implementations, a corrective factor associated with each axis is determined (904). The determination is based on the vibration measurements. For example, the determination may be effected by the processing circuitry by matching the detected vibrations to predetermined corrective factors. For example, a look-up table may be referenced to determine the corrective factors. The corrective factors may be pre-determined using equation (20).

In some implementations, the oscillator is controlled based on at least one corrective factor (906).

To illustrate the capabilities of the apparatus and methodologies described herein, exemplary results are presented.

Figure 10:
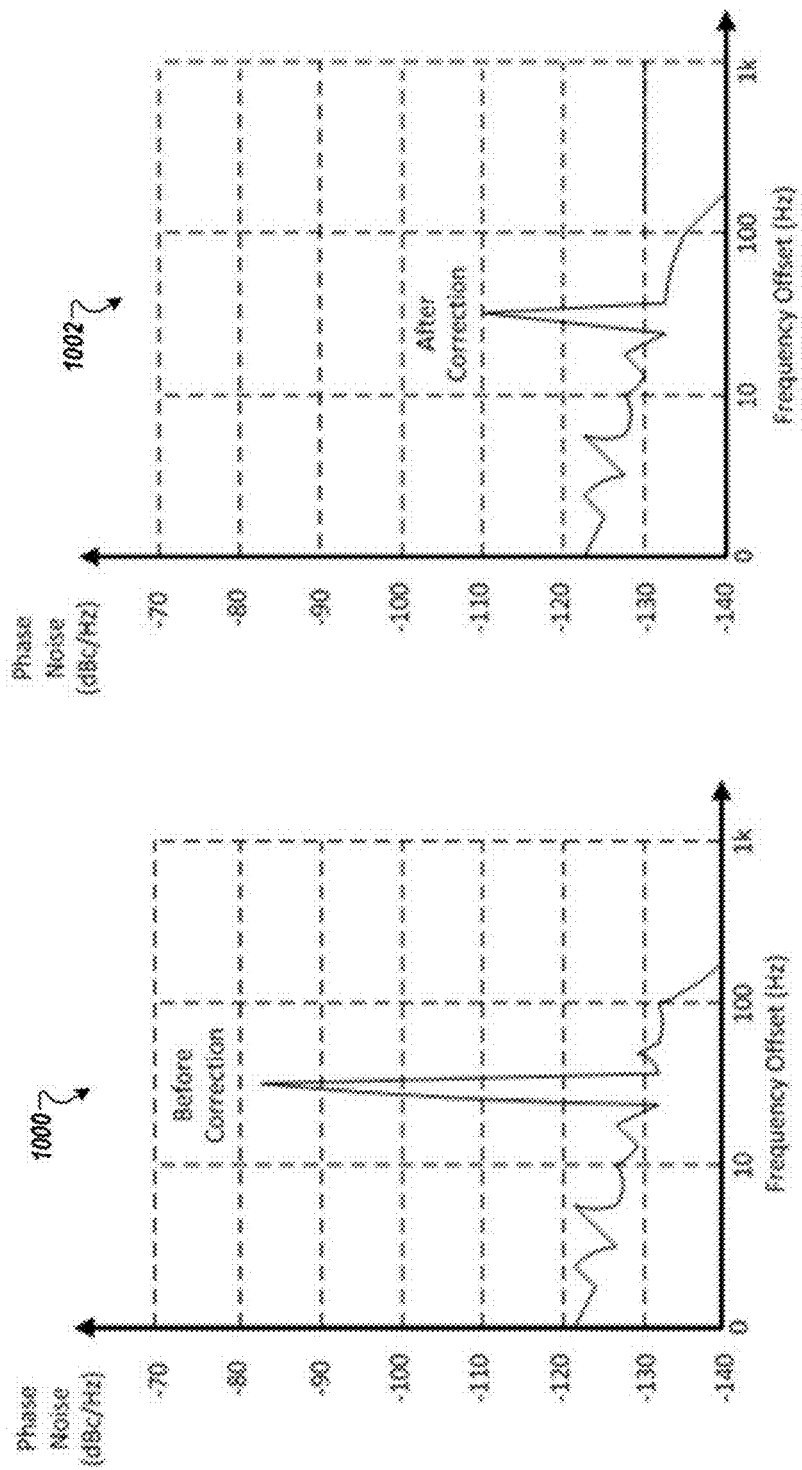
FIG. 10 is a schematic that shows exemplary phase noise plots according to one example.
Figure 11:
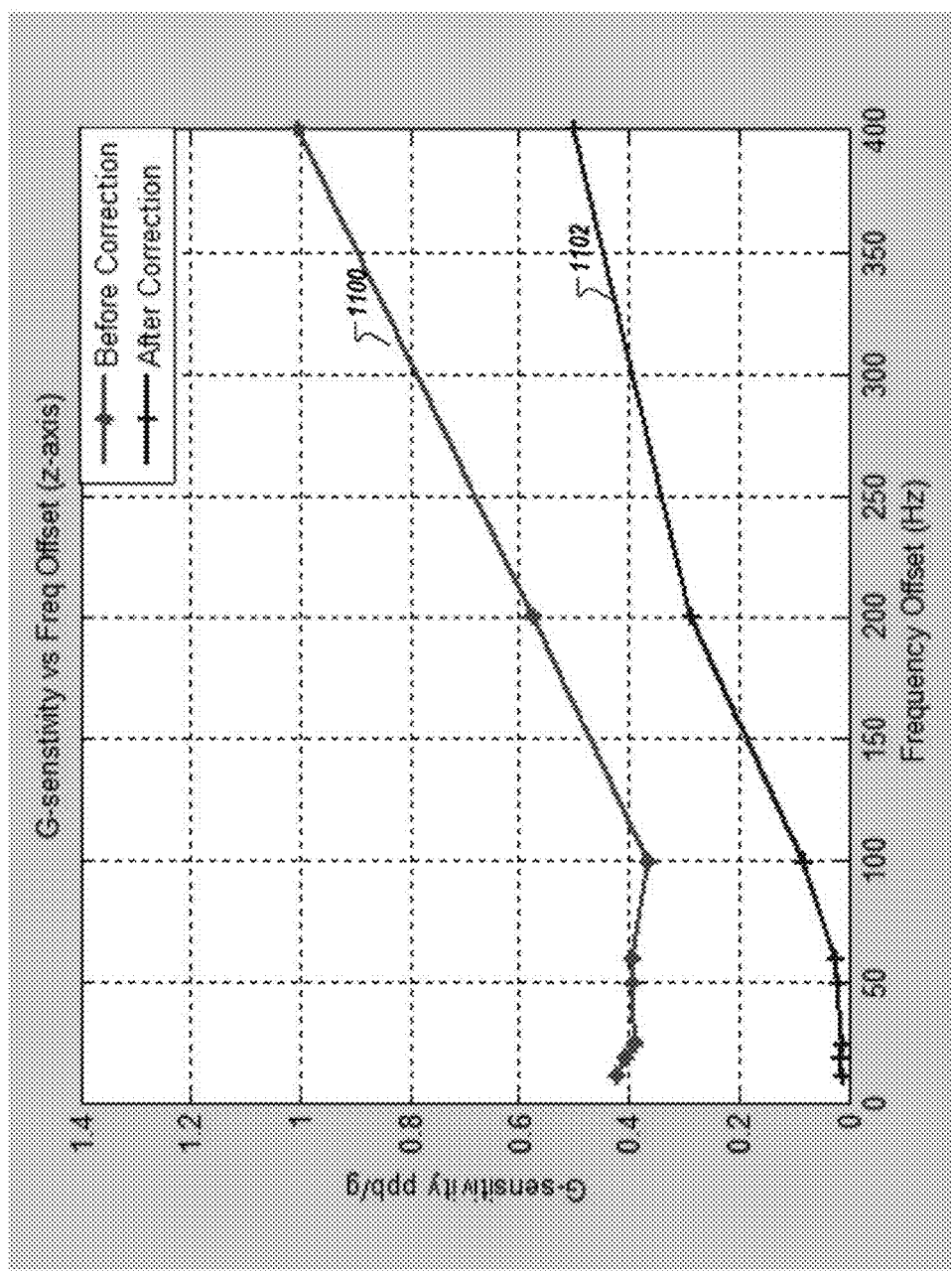
FIG. 11 is a schematic that shows the g-sensitivity before and after vibration correction according to one example.

The experimental data shown in FIG. 10 and FIG. 11 were measured and corrected utilizing mixed signal implementation 700 shown in FIG. 7 with the PCB placement shown in FIG. 8A. The amplitude and phase of corrective signal was varied for robustness and found to follow trend shown in FIG. 5. Significant phase and amplitude inaccuracies have to occur to have a detrimental effect and therefore there is not significant risk added to the system. FIG. 10 shows exemplary phase noise plots before (1000) and after correction (1002).

Experimental improvement is shown up to 400 Hz with significant performance increase below 100 Hz. The corrective limitations past 400 Hz is found to be related to MEMS sampling rate and time delay induced by DSP required for appropriate correction.

The limitations at higher frequency shown in FIG. 11 are found to be related to time delay associated with the MEMS sensor, data processing, and limited modulation response of the VCXO. MEMS sensors with higher sampling and extended modulation bandwidth may be employed for further enhanced performance at higher frequencies.

FIG. 11 is a schematic that shows the g-sensitivity before and after vibration correction according to one example. Trace 1100 shows the g-sensitivity (ppb/g) before vibration correction and trace 1102 shows g-sensitivity after correction.

Two different topologies are described herein, pure analog and mixed signal approach, which increase a designer ability to provide excellent phase noise and short-term stability under both vibrating and static environments.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method for vibration correction in an oscillator, the method comprising:
    sensing vibrations along one or more axes via at least one accelerometer mounted on the oscillator;
    determining a g-sensitivity vector of the oscillator using measurements obtained using a vibration table and a spectrum analyzer;
    calculating corrective factors as a function of the g-sensitivity vector;
    storing the corrective factors in a look-up table;
    determining particular corrective factors based on an acceleration signal received from the at least one accelerometer by referencing the corrective factors in the look-up table; and
    controlling the oscillator based on at least the particular corrective factors.

2. The method of claim 1, wherein the at least one accelerometer is a 3-axis accelerometer.

3. The method of claim 1, further comprising:
    using a second and a third accelerometer, wherein
    the at least one accelerometer, the second accelerometer, and the third accelerometer are each mounted along an orthogonal axis to independently measure the acceleration each independent axis.

4. The method of claim 3, wherein the orthogonal axis is an x-axis, y-axis, or z-axis.

5. The method of claim 1, wherein the at least one accelerometer is manufactured using MEMS (Microelectromechanical system technology.

6. The method of claim 1, wherein the at least one accelerometer is positioned below the oscillator.

7. The method of claim 1, further comprising:
    controlling the oscillator using a filter, the weight of the filter being pre-calibrated based on a frequency response of the oscillator.

8. The method of claim 7, wherein the filter is an analog filter.

9. The method of claim 7, wherein the filter is a digital filter.

10. The method of claim 1, wherein determining the g-sensitivity vector includes applying $$\gamma(f) = \frac{2w_v}{\alpha_{vib} w_o} 10^{L(f)/20}$$

where $w_v$ is the vibration frequency, $\alpha_{vib}$ is the amplitude of the acceleration, $w_o$ is the fundamental frequency, and L is the relative level of the first order sideband relative to the fundamental frequency.

11. The method of claim 1, further comprising:
measuring a spectral response of the oscillator along the one or more axes; and
calculating the corrective factors as a function of the g-sensitivity vector and the spectral response of the oscillator.

12. The method of claim 11 wherein the corrective factors are determined by applying $$\frac{L_x(f)\gamma_x(f)}{2\pi K_{VCO}} = c_x \text{ and } \frac{L_y(f)\gamma_y(f)}{2\pi K_{VCO}} = c_y \text{ and } \frac{L_z(f)\gamma_z(f)}{2\pi K_{VCO}} = c_z$$

where $L_x(f), L_y(f)$, and $L_z(f)$ are the spectral response of the oscillator along x,y,z axis, $Y_x(f), Y_y(f), Y_z(f)$ are the components of the g-sensitivity vector along the x,y,z axis respectively, and $K_{vco}$ is the tuning slope of the oscillator.

13. An oscillator circuit, comprising:
a crystal oscillator providing an RF (Radio Frequency) output;
an accelerometer mounted on the crystal oscillator for sensing vibrations and for providing an acceleration signal associated with the vibrations; and
processing circuitry configured to
determine a g-sensitivity vector of the oscillator using measurements obtained using a vibration table and a spectrum analyzer,
calculate corrective factors as a function of the g-sensitivity vector;
store the corrective factors in a look-up table;
determine particular corrective factors as a function of the acceleration signal by referencing the corrective factors in the look-up table; and
control the crystal oscillator based on at least the particular corrective factors.

14. The oscillator circuit of claim 13, wherein the corrective factors are a function of a g-sensitivity vector, and a spectral response of the crystal oscillator along the one or more axes, wherein the g-sensitivity vector and the spectral response are pre-measured.

15. The oscillator circuit of claim 13, wherein the processing circuitry is further configured to:
control the crystal oscillator using a filter, the weight of the filter being pre-calibrated based on a frequency response of the crystal oscillator.

16. The oscillator circuit of claim 15, wherein the filter is an analog filter.

17. The oscillator circuit of claim 15, wherein the filter is a digital filter.

18. A communication system, comprising:
at leak one electronic device being clocked by an oscillator circuit, wherein the oscillator circuit includes
a crystal oscillator providing an RF (Radio Frequency) output,
an accelerometer mounted on the crystal oscillator for sensing vibrations and for providing an acceleration signal associated with the vibrations, and
processing circuitry configured to
determine a g-sensitivity vector of the oscillator using measurements obtained using a vibration table and a spectrum analyzer:
calculate corrective factors as a function of the g-sensitivity vector; store the corrective factors in a look-up table:
determine particular corrective factors as a function of the acceleration signal by referencing the corrective factors in the look-up table; and
control the crystal oscillator based on at least the particular corrective factors.

* * * * *